United States Patent
Vaucher et al.

(10) Patent No.: US 9,435,842 B2
(45) Date of Patent: Sep. 6, 2016

(54) CIRCUIT AND METHOD FOR DETECTION OF IC CONNECTION FAILURE

(71) Applicant: NXP B.V., Eindhoven (NL)

(72) Inventors: Cicero Silveira Vaucher, Eindhoven (NL); Mingda Huang, Eindhoven (NL); Antonius de Graauw, Haelen (NL)

(73) Assignee: NXP B.V., Eindhoven (NL)

( * ) Notice: Subject to any disclaimer, the term of this patent is extended or adjusted under 35 U.S.C. 154(b) by 216 days.

(21) Appl. No.: 14/472,179

(22) Filed: Aug. 28, 2014

(65) Prior Publication Data

US 2015/0108996 A1    Apr. 23, 2015

(30) Foreign Application Priority Data

Oct. 22, 2013 (EP) ..................................... 13189631

(51) Int. Cl.
*G01R 31/04* (2006.01)
*G01R 31/02* (2006.01)
*G01R 31/28* (2006.01)
*G01R 31/00* (2006.01)

(52) U.S. Cl.
CPC ............. *G01R 31/02* (2013.01); *G01R 31/048* (2013.01); *G01R 31/2822* (2013.01); *G01R 31/006* (2013.01)

(58) Field of Classification Search
USPC .................. 324/537, 500, 140 R; 361/56, 57; 702/64; 257/E23.023
See application file for complete search history.

(56) References Cited

U.S. PATENT DOCUMENTS

| | | | | |
|---|---|---|---|---|
| 7,505,238 | B2* | 3/2009 | Woo | H02H 9/046 361/111 |
| 7,834,640 | B2* | 11/2010 | Nurmi | G01R 31/04 324/538 |
| 2003/0042888 | A1 | 3/2003 | Shirahama et al. | |
| 2009/0079457 | A1* | 3/2009 | Cheng | G01R 31/2853 324/762.06 |
| 2010/0246152 | A1* | 9/2010 | Lin | G06F 1/16 361/783 |
| 2012/0019968 | A1* | 1/2012 | Hsieh | H03F 1/52 361/56 |
| 2012/0113553 | A1* | 5/2012 | Dupuis | H01L 23/60 361/56 |

OTHER PUBLICATIONS

Wojnowski, M. "Embedded Wafer Level Ball Grid Array (eWLB) Technology for High-Frequency System-in-Package Applications", IEEE Intl. Microw. Symp. Dig., pp. 1-4 (Jun. 2013).
Knapp, H. et al. "Three-Channel 77 GHz Automotive Radar Transmitter in Plastic Package", IEEE Radio Frequency Integrated Circuits Symp., pp. 119-122 (Jun. 2012).
Extended European Search Report for EP Patent Appln. No. 13189631.8 (Apr. 8, 2014).

* cited by examiner

*Primary Examiner* — Melissa Koval
*Assistant Examiner* — Nasima Monsur
(74) *Attorney, Agent, or Firm* — Rajeev Madnawat (57) ABSTRACT

The invention provides a testing circuit for testing a connection between a chip and external circuitry. A current source is used to inject a DC current towards the connection to be tested from the chip side. On-chip ESD protection is provided giving a path between the connection to be tested and a fixed voltage line. A shunt path is also coupled to the connection to be tested on the external circuitry side. It is determined if the current source current flows through the ESD protection circuit, and this can be used to determine whether or not the connection to be tested presents an open circuit for the DC test current.

16 Claims, 5 Drawing Sheets

CIRCUIT AND METHOD FOR DETECTION OF IC CONNECTION FAILURE

CROSS-REFERENCE TO RELATED APPLICATIONS

This application claims the priority under 35 U.S.C. §119 of European patent application no. 13189631.8, filed on Oct. 22, 2013, the contents of which are incorporated by reference herein.

The invention relates to the detection of failures in IC bonds, for example using a ball grid array.

Until recently, mm-wavelength systems operating above around 50 GHz have been formed with chip-on-cavity techniques, in which a naked die is placed into a cavity within a PCB, and further connection to the PCB is made by means of bond-wires.

This is a satisfactory technique from the electrical and thermal perspectives, as the length of the bond wires can be kept very short and the bulk of the IC is directly connected to a ground plane on the PCB, facilitating heat flow out of the die. This method, however, is not suitable for products for low-cost high volume markets, as creating an accurate cavity on the PCB is expensive, and the wire bonding is a delicate operation.

The mass production problem mentioned above can be effectively addressed with, for example, the use of a recently-developed packaging technology called embedded wafer-level ball grid array (eWLB).

This approach is discussed in detail in the paper «Embedded Wafer Level Ball Grid Array (eWLB) Technology for High-Frequency System-in-Package Applications», Maciej Wojnowski and Klaus Pressel, IEEE IMS 2013.

Figure 1:
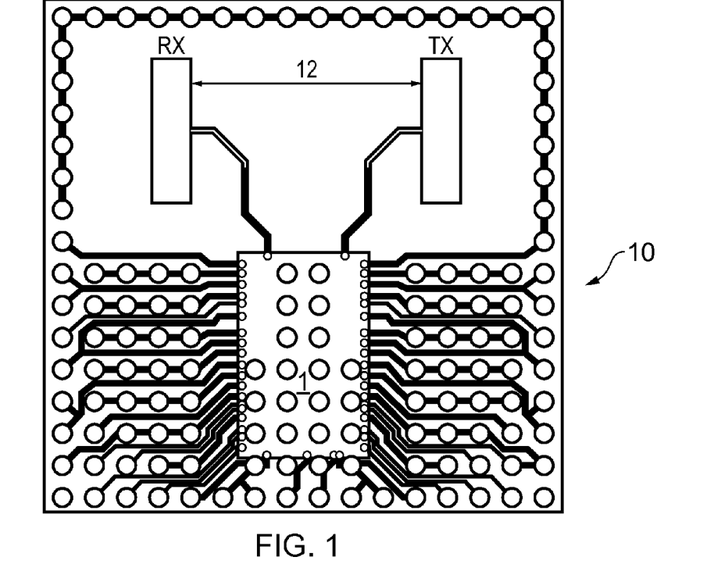
FIG. 1 shows a known wafer-level ball grid array.

In this approach, shown in FIG. 1, the active die 1 is embedded into a molding compound which effectively encapsulates and creates a "fan-out" 10 next to the chip, which is used to place solder balls for connection to a PCB. The connection from the chip to the solder balls is done with a redistribution metallization layer (RDL), which can also be conveniently used for implementation of passive structures such as dipole antennas 12, also seen in FIG. 1.

Despite the attractive electrical properties of the eWLB package as mentioned above, the connection from the moulded compound to the PCB through the solder balls can be subject to mechanical strain, due to differences in the thermal expansion coefficients of the mould and board material. This can lead to solder ball breakage after a number of temperature cycles, such as is relatively common in automotive environments.

If a ball breaks then the breakage must be detectable, so that a decision can be taken as to whether or not to disable the system, so that no wrong/mistaken decisions can be taken as a consequence of the decreased quality of the connection. This issue arises also for other connection methodologies between different components within a package, and the invention should be understood accordingly.

One example of a system where this fault detection capability is important is a car-radar module used as part of an autonomous emergency breaking (AEB) system. Such a system detects if the vehicle is in a collision course with another vehicle or possibly a pedestrian, and emits a warning to the driver early on and possibly decides to apply the brakes if the driver does not react, such as to mitigate the severity of the possible crash, or to avoid it altogether.

It is evident that this is a safety critical system, and that erroneous decisions taken by the system can have severe consequences, both in the case of false negatives (a pedestrian is not detected) and in false positive situations (the brakes are activated while there is no imminent risk of a collision, in which case a car can crash into the back of the vehicle inadvertently).

Protocols for guarantying functional system operation, or detecting fault conditions in sub-systems so that the system can be disabled at higher levels, are described for example in the ISO 26262 standard.

This invention is concerned in particular with the detection of one specific system failure mode, namely breakage of IC bonds connecting, for example, an mm-wavelength radar transceiver to an application board containing antennas. Especially difficult to detect are breakages in the RF connections from the receive ("RX") antennas to the low noise amplifiers ("LNAs") and from the power amplifiers ("PAs") to the transmit ("TX") antennas.

This difficulty is due to the fact that, if a connection breaks, there is in general still a capacitive coupling of the PCB towards the package such that an RF signal is still present at the LNA from the RX antenna or transferred to the antenna from the PA. However, electrical properties of the capacitive connection will be different from nominal values in terms of insertion phase and worse in terms of insertion loss, so that the radar module angular discrimination and sensitivity will be compromised.

It is therefore important that the breakage is reliably detected and communicated for example to a system controller element, for further actions to be taken such as defined in a functional safety protocol.

Figure 2:
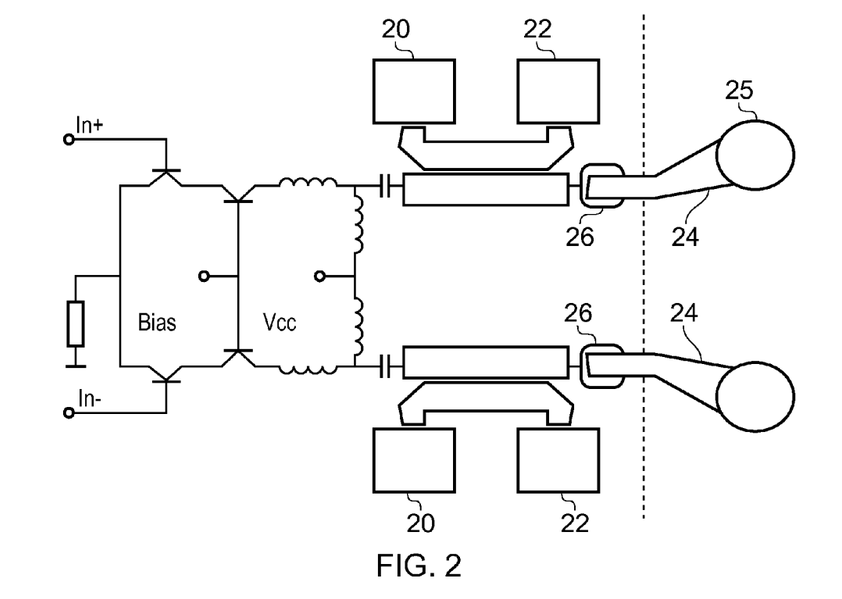
FIG. 2 shows a couplers used in a known circuit.

FIG. 2 shows a commercially available product which is described in the article "Three-Channel 77 GHz Automotive Radar Transmitter in Plastic Package", Herbert Knapp et al., IEEE RFIC Symposium 2012. FIG. 2 shows the architecture of the directional couplers for one differential signal connection. This figure is taken from the paper identified and for a full description the reader is referred to the paper itself.

The product is a transmitter IC for car-radar applications in the 76-77 GHz band. The IC consists of three transmit paths and a voltage controlled oscillator ("VCO") for local oscillator ("LO") generation. The strategy used for ball-break detection relies on directional couplers and power sensors. At each transmit output there is a directional coupler and two power sensors 20, 22 connected to the coupled lines. The redistribution layer 24 provides the solder ball 25 to IC pad 26 connections.

The working assumption is that in a normal connection the power flows out of the chip into the PCB and very little power is reflected back into the chip; in this condition the outer power sensor 22 close to the pad will indicate a certain value representing the power going into the PCB, and the inner power sensor 20 at the chip side will indicate a very low value representative of the good RF connection, as there is little power reflected back into the chip. If the ball then breaks the assumption is that a significant fraction of the output power will be reflected into the chip, and the reading on the inner power sensor becomes comparable to the reading on the outer sensor, and an error can then be flagged to the controller.

In practice this detection method will not detect all breakage situations, as in many cases the remaining capacitive coupling keeps the reflection coefficient relatively small, whereas the insertion loss is clearly affected. In this case there is a functional safety problem, as the radar sensitivity is compromised but there is no indication towards the system controller of this fact. Thus, the detection method can be unreliable.

There are other drawbacks to this approach. The directional couplers are generally large in size, and add loss to the signal path from the PA to the antenna. There are two power sensors needed for each connection that needs to be checked, increasing the chip size and power dissipation.

For differential circuit implementation and differential connections to the PCB, there are two directional couplers and four power sensors needed (as shown in FIG. 2), compounding the area and power dissipation disadvantages mentioned above.

Last but not least, the concept relies on a power source being present that serves as the reference for the outgoing power level, to be compared to the reflected power. This is not a major drawback in transmitter circuits. However, this aspect becomes a bottleneck if the concept is to be applied to detect ball breaks in receiver circuits; ideally a ball break detection method should only make use of existing mm-wavelength circuitry. With this condition, it is not possible to apply the concept to receiver circuits. The insertion loss of the directional coupler would also add to the noise figure of the receiver section.

The invention is defined by the claims.

According to the invention, there is provided a testing circuit for testing a an IC connection between an RF chip and external circuitry, the testing circuit comprising:

a current source for injecting a DC current towards the connection to be tested;

an on-chip ESD protection circuit which provides a path between one side of the connection to be tested and a fixed voltage line;

a shunt path coupled to the other side of the connection to be tested; and a testing unit, wherein the testing unit is adapted to determine if the current source current flows through the ESD protection circuit and thereby determine whether the connection to be tested presents a short circuit for DC.

This testing circuit makes use of an ESD protection circuit. Essentially, the current flowing through the ESD protection circuit depends on whether the connection to be tested is functioning as an open circuit or short circuit for the DC test current. If it functions as a short circuit, this is indicative of a correctly functioning connection. The ESD protection path and the shunt path are on opposite sides of the connection to be tested.

Properties of the ESD protection circuit are thus used. This is found to be very effective in the microwave and mm-wavelength frequency range. For example, at these frequencies, a simple shunt inductor to ground or to the positive supply voltage is a very effective ESD clamp device.

The connection to be tested is preferably a solder ball, for example of a wafer level ball grid array.

An inductor-based ESD device of this type can be designed to present high impedance at the desired operation frequencies, not interfering with the signal path, but at lower frequencies and DC, on the other hand, the inductor short-circuits the ESD pulses to ground, protecting the active devices in the LNA and/or PA circuitry.

The testing unit can be arranged to monitor a DC voltage level, making use of a current source to inject a (small) amount of current into the line to be checked, and a level detector circuit. A simple DC level detector is sufficient to detect a connection failure such as a ball-break event.

In a first set of examples, the ESD protection circuit is between one side of the connection to be tested and a constant voltage line, and the shunt path is between the other side of the connection to be tested and a constant voltage line. If the connection is intact, the shunt path provides the lowest impedance path for the test current, whereas if the connection presents an open circuit, then the ESD protection circuit provides the path for the test current.

The current source output can then be coupled to the ESD protection circuit. The ESD protection circuit can in this case comprise an inductor in series with a pair of back-to-back diodes.

In another set of examples, the ESD protection circuit is between one side of the connection to be tested and a constant voltage line, and the shunt path is between the other side of the connection to be tested and a second connection, wherein the current source output is coupled to the second connection. In this case, the shunt path connects two connections, so that if the connections are intact, there is a series path through the shunt path and the ESD protection circuit. The ESD protection circuit can then comprise an inductor.

In all cases, the shunt path can comprise an off-chip RF choke (i.e. inductor).

An off-chip series path can be provided between the connection to be tested and an antenna port for connection to an antenna. The testing is thus in respect of connections to an antenna (a transmit and/or receive antenna).

The testing unit can comprise a voltage comparator circuit for providing an output dependent on whether or not the DC test current passes through the ESD protection circuit.

The invention also provides an RF circuit comprising an RF chip and a PCB to which the RF chip is connected using a ball grid array, the PCB including an antenna, and a testing circuit of the invention for testing the balls which connect to the antenna terminals.

The invention also provides a method of testing a connection between an RF chip and external circuitry, comprising:

injecting a DC current towards the connection to be tested;

providing a path between one side of the connection to be tested and a fixed voltage line through an on-chip ESD protection circuit;

providing a shunt path coupled to the other side of the connection to be tested; and determining if the current source current flows through the ESD protection circuit and thereby determine whether the connection to be tested presents a short circuit for DC.

Examples of the invention will now be described in detail with reference to the accompanying drawings, in which.

The invention provides a testing circuit for testing a connection between a chip and external circuitry. A current source is used to inject a DC current towards the connection to be tested from the chip side. On-chip ESD protection is provided giving a path between the connection to be tested and a fixed voltage line. A shunt path is also coupled to the connection to be tested on the external circuitry side. It is determined if the current source current flows through the ESD protection circuit, and this can be used to determine whether or not the connection to be tested presents an open circuit for the DC test current.

This testing approach relies on the principle that ESD protection on RF inputs and outputs are typically based on an inductor connection to ground or to a high voltage rail (VDD). This connection is therefore a short circuit for DC signals.

Figure 3A:
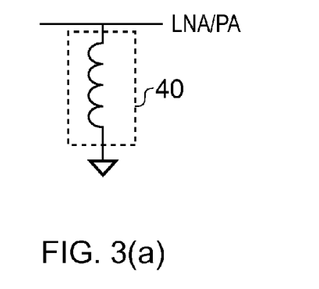
FIGS. 3(a) and 3(b) show two known ESD protection circuits suitable for RF circuits.

FIG. 3(a) shows a first example of ESD protection circuit. It comprises an inductor 40 between the line to be protected and a constant voltage rail, which can be ground or a high voltage rail.

Figure 3B:
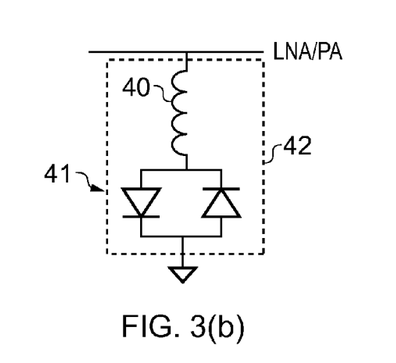

FIG. 3(b) shows a second example of ESD protection circuit 42. It comprises an inductor 40 in series with a back-to-back diode pair 41, between the line to be protected and a constant voltage rail, which can be ground or a high voltage rail.

In each case, the line to be protected can be the line leading to an external connection pad of the chip, which internally couples to a power amplifier (in the case of an external connection pad to a transmit antenna) or low noise amplifier (in the case of an external connection pad to a receive antenna) for example.

Figure 4A:
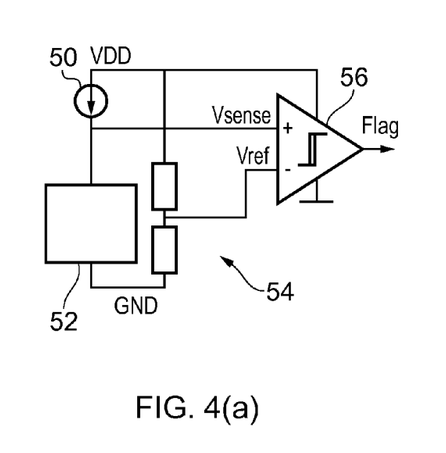
FIGS. 4(a) and 4(b) show schematically the detection approach of the invention for detecting a defect in a ball of a ball grid array.
Figure 4B:
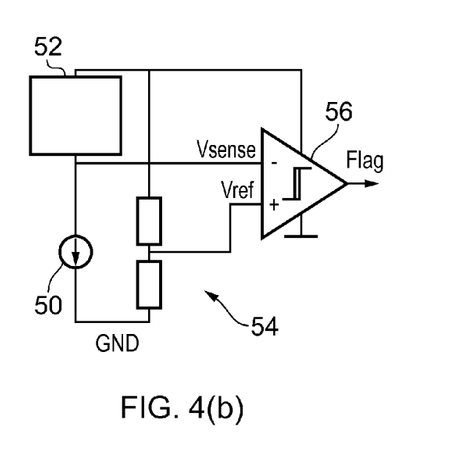

The level of ESD protection obtained with these two designs differs, due to the series diodes in the implementation of FIG. 4(b).

This invention will be described for implementation with either of these two ESD protection circuits. Which approach to be used will depend on the desired ESD protection characteristics.

The invention makes use of a detection of whether a connection presents an open circuit or a closed circuit. As explained above, the invention is of particular interest for detecting solder ball failures, but it is applicable more generally. The description below refers to solder balls by way of example only.

The open or closed circuit condition can be detected based on the current present in the ESD protection circuit.

The fundamental idea of the detector concept is presented in FIG. 4. FIG. 4(a) shows the concept for an ESD circuit which connects to ground GND and FIG. 5(b) shows the concept for an ESD circuit which connects to a high voltage rail VDD.

FIG. 4(a) shows a constant current source 50 which supplies a current to a detection circuit 52, which alters its characteristics depending on the nature of the ball being tested. For each ball to be tested, detection circuit 52 behaves as a short circuit for DC, when the connection to be tested is intact. The detection circuit includes the ESD protection circuit, as this plays a role in the functioning of the detection circuit.

A reference voltage Vref is generated by a potential divider 54, and a comparator 56 (preferably with hysteresis as shown) compares the voltage Vsense on a sense pin with the reference voltage. This comparator monitors the DC voltage level at the current injection node, which is the sense pin voltage Vsense. For a correct ball connection, the sense pin voltage level will therefore be equal to ground and a Flag signal will then be inactive (low logic level).

If the connection is interrupted, then the detection circuit 52 behaves as an open circuit, and the sense pin voltage Vsense rises to VDD which then triggers the comparator raising the Flag signal.

In the version of FIG. 4(b), the detection circuit 52 connects to the high voltage rail VDD. The sense pin voltage Vsense in this case is VDD in the case of a short circuit (correctly functioning ball) and is GND in the case of an open circuit (faulty ball).

The flag output "Flag" can either be connected to a pin, or to an internal safety monitoring circuitry that is connected to a number of ball-break detectors.

The detection circuit 52, for presenting a short circuit or an open circuit, can take a number of forms.

Figure 5:
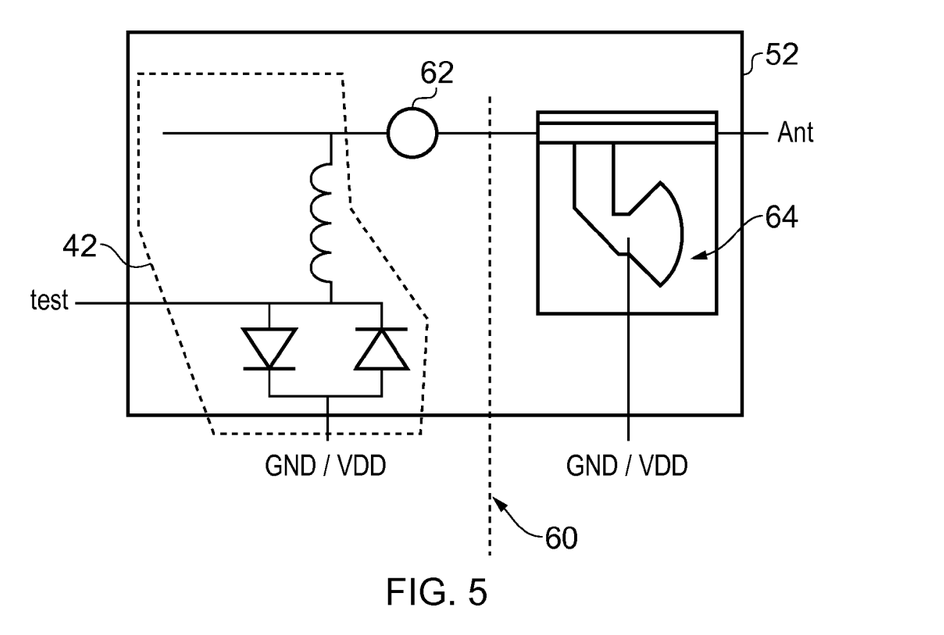
FIG. 5 shows a first example of the detection block for use in the circuits of FIGS. 4(a) and 4(b)

FIG. 5 shows a first example of the detection circuit 52, making use of the ESD protection circuit design of FIG. 3(b).

The detection circuit 52 has a test node input "test", to which the current source output is provided. As shown in FIG. 5, part of the circuit is on-chip (left of the dotted line 60) and part is off chip. The ball 62 to be tested of the ball grid array provides the connection between the on-chip and off-chip parts of the circuit. The ESD protection circuit 42 is on-chip. The ESD circuit can be coupled to ground or to the high voltage rail as shown.

The connection to the active circuitry to be protected, e.g. LNA or PA, is not explicitly shown. For the sake of simplicity, the connection is assumed to be AC coupled, whereas in practice a DC connection, for example to bias the output stage of a PA, is possible without changing the concept.

In FIG. 5, the current source injects a test current into the test node. Under normal operating conditions, the RF ball connection is intact and the test current will flow out of the IC and find a return path through a connection to GND/VDD on the PCB (off-chip). This connection is implemented with an "RF choke" structure 64.

At mm-wavelength operation frequencies, the RF choke 64 can be easily implemented with a radial-stub and a λ/4 transmission line on the PCB, which transforms the low RF impedance from the radial stub to a high impedance connection at the transmission line which connects the RF ball to an antenna port "Ant".

If the RF ball 62 breaks, then the test current cannot reach the RF choke anymore, and will find a return path through one of the anti-parallel connected diodes, raising (or dropping) the voltage on the "test" node by a diode threshold voltage. With a properly chosen reference voltage (Vref in FIG. 5), the threshold voltage can the easily trigger the comparator and raise the Flag signal.

Figure 6:
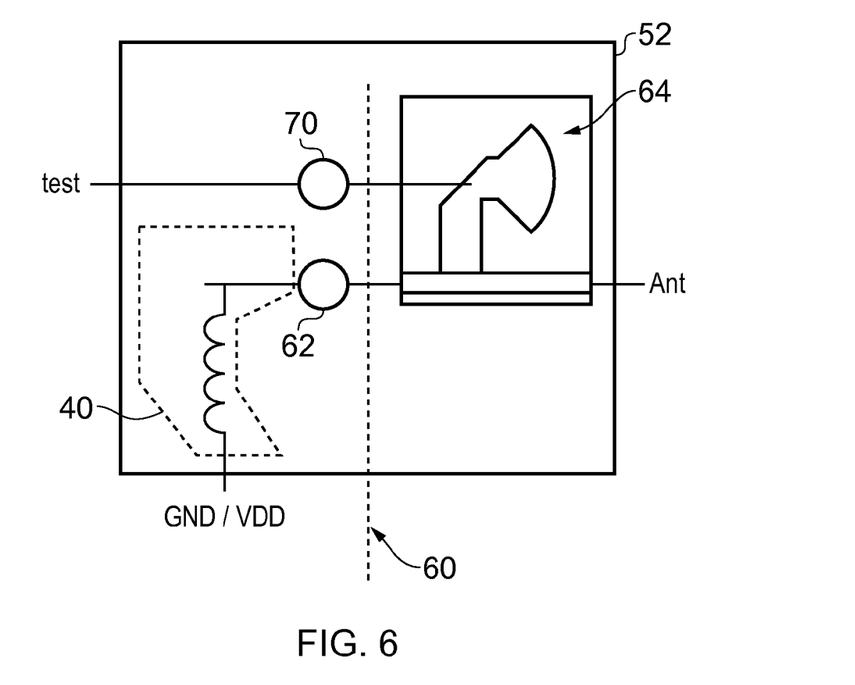
FIG. 6 shows a second example of the detection block for use in the circuits of FIGS. 4(a) and 4(b)

FIG. 6 shows a second example of the detection circuit 52, making use of the ESD protection circuit design 40 of FIG. 3(a).

With this configuration, the test current flows out of the IC by means of an additional test ball 70. This current is coupled to the RF choke structure 64 at a convenient point, and returns to GND/VDD via the RF ball being tested 62 and the inductor 40.

The test in this case can only confirm that both balls are correctly functioning, rather than identifying which of a pair has failed.

Similarly to the previous embodiment, under normal operation the test node voltage equals GND (if the ESD circuit connects to GND) or VDD (if the ESD circuit connects to VDD). In the case of a broken RF ball connection, the test voltage changes (rising from GND or falling from VDD), triggering a Flag signal at the comparator output.

This circuit has an additional test ball. However, there can be practical situations in which a simpler ESD cell has advantages, for example depending on the ESD properties and the level of required protection for a specific circuit.

Figure 7:
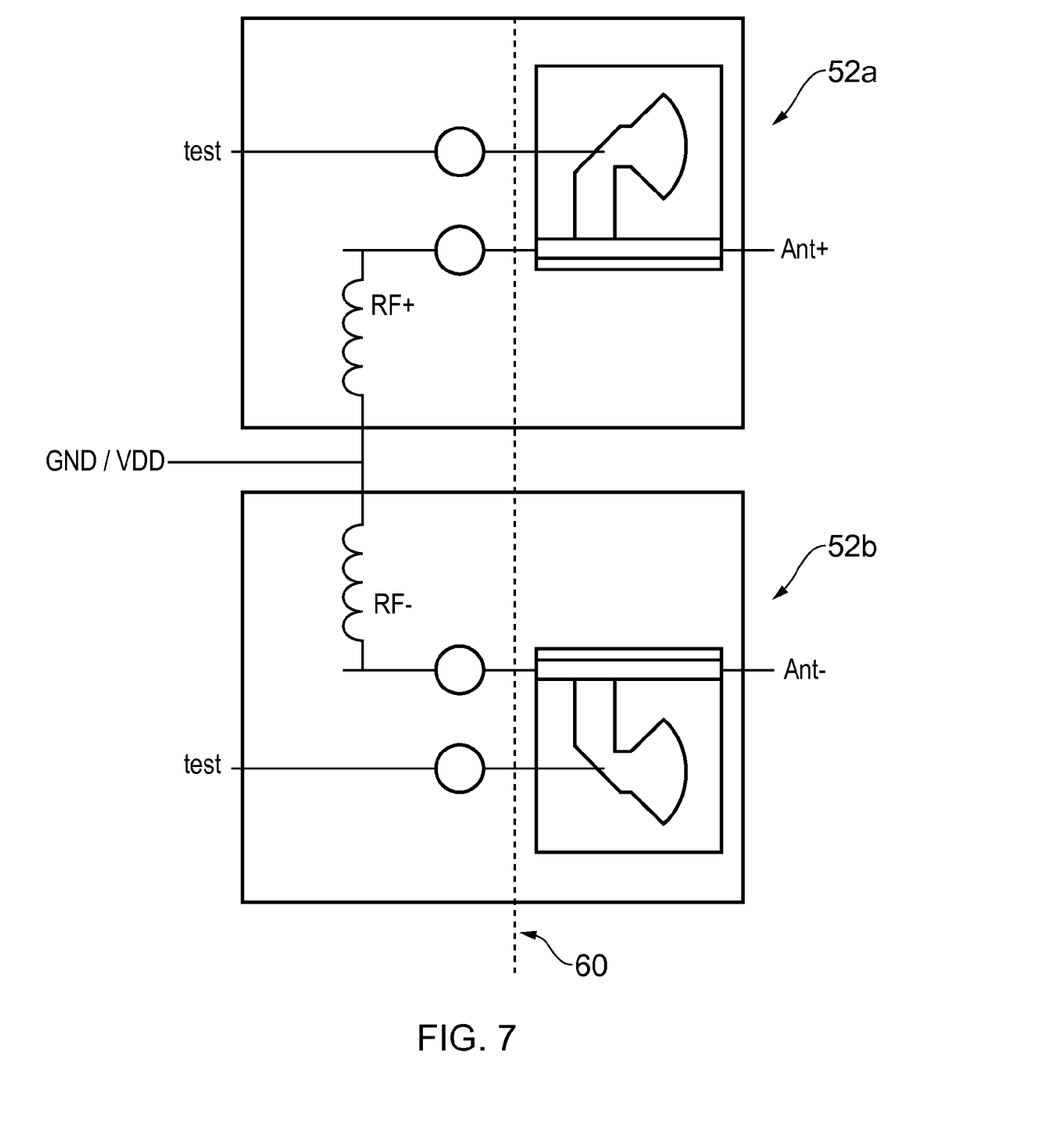
FIG. 7 shows two of the circuits of FIG. 6 combined to provide testing for a pair of differential antenna terminals.

FIG. 7 shows an embodiment to be used for differential antenna ports. "Ant+" and "Ant−" and differential RF circuit lines "RF+" and "RF−". The circuit is simply a combination of two of the circuits of FIG. 6 in parallel, shown as 52a and 52b. In this embodiment, the antenna ports are preferably galvanically isolated from each other.

There are practical situations where the differential antenna ports are DC coupled to each other, by means for example of a balun element that converts the differential signals from/to the IC towards a single-ended antenna element. In this case, it is possible to combine the two types of ESD elements as shown above.

Figure 8:
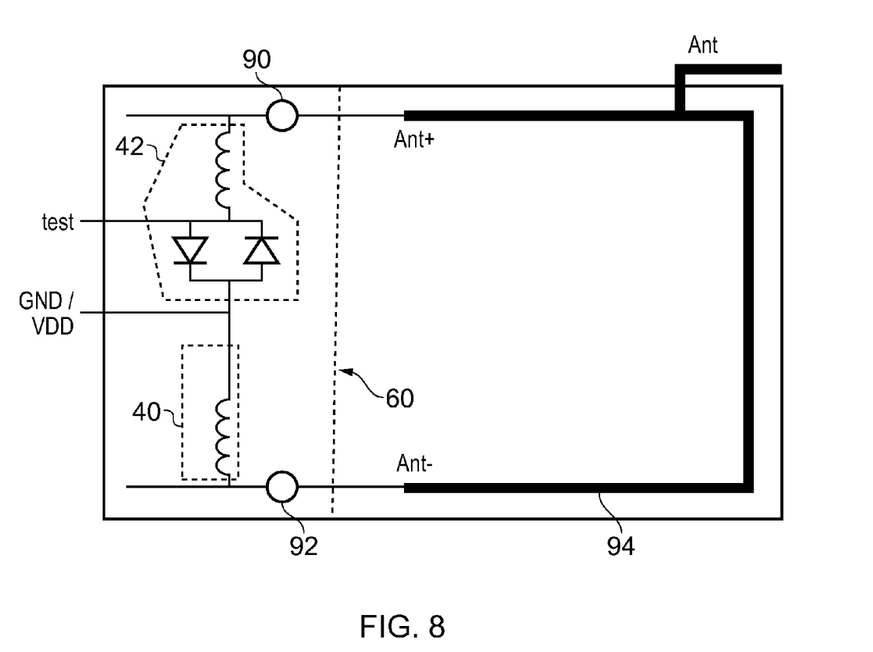
FIG. 8 shows a circuit to provide testing for a pair of differential antenna terminals which makes use of the ESD circuits of FIGS. 4(a) and 4(b).

FIG. 8 shows this approach. A first ball to be tested 90 is connected to the fixed voltage line (GND or VDD) through an ESD circuit 42 of the type shown in FIG. 4(b) and a second ball to be tested 92 is connected to the fixed voltage line (GND or VDD) through an ESD circuit 40 of the type shown in FIG. 3(a). This arrangement avoids the need for additional test balls.

The test current flows via the ball 90, the balun 94 and the ball 92, finding its return path to ground via the ESD element 40.

A brake of either of the balls being tested will lead to the voltage at the Test node to raise to a diode threshold voltage, triggering a Flag signal at (one of) the comparators of FIG. 4.

The differential antenna ports are galvanically coupled to each other via the balun element 94 on the PCB.

The invention is applicable to circuits in which detection of faulty connections from the chip to the PCB is of fundamental importance, for example in relation to functional safety requirements. Specific examples are car-radar ICs meant for safety-critical applications, such as autonomous emergency braking (AEB).

The invention provides a ball-break detection which makes use of the ESD structures for example as used in mm-wavelength products. These ESD structures include inductive elements, possibly in series with anti-parallel coupled diodes. At DC and lower frequencies the inductors are essentially a short-circuit connection. The ball break detection circuit monitors a DC level making use of a current source to inject a small amount of DC current into the line to be checked. In the case of a ball-break event, the DC connection of the test current via the ESD element is interrupted and a simple DC level detector is sufficient to trigger a Flag signal indicating the breakage. The invention has substantial advantages with respected to state-of-the-art solutions built around directional couplers and multiple power sensors.

The invention is of particular interest to circuits with mm-wavelength frequency signals. However the invention applies generally to RF circuitry. In particular, the invention is of interest for circuits in which the operation frequency of the signal carrier leads to a significant impedance difference of an inductive ESD device, with respect to DC.

The invention has been described when used to test bond pads which couple an antenna to a transmit/receive circuit. However, the invention can be used to test bond pads or other connections between any two devices, where RF signals are to be relayed between those devices, by signal lines which cross the connections.

The invention can also applied to IF connections between chips, as long as the IF frequency is significantly higher that DC (as is the case in heterodyne systems). In this case, the connection is not between an antenna and the IC, but between two ICs. Thus the invention relates to connections between an RF chip and anything which connects to that RF chip. This is what is meant by "external", i.e., external to the chip in question. The connected components may of course both be within a common package.

The ESD protection circuit in the examples above makes use of an inductor. However, other ESD protection circuits can be used, for example based on diodes, resistors and transistors. ESD protection circuits including inductors are however preferred since they give rise to the substantially different impedances at DC or RF frequencies as well as providing effective ESD protection at these frequencies.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A testing circuit for testing an IC connection between an RF chip and external circuitry, the testing circuit comprising: a current source for injecting a DC current towards the connection to be tested; an on-chip ESD protection circuit which provides a path between one side of the connection to be tested and a fixed voltage line; a shunt path coupled to the other side of the connection to be tested; and a testing unit, wherein the testing unit is adapted to determine if the current source current flows through the ESD protection circuit and thereby determine whether the connection to be tested presents a short circuit for DC, wherein the ESD protection circuit is between one side of the connection to be tested and a constant voltage line, and the shunt path is between the other side of the connection to be tested and a second connection, wherein the current source output is coupled to the second connection.

2. A circuit as claimed in claim 1, wherein the ESD protection circuit is between one side of the connection to be tested and a constant voltage line, and an off-chip shunt path is between the other side of the connection to be tested and a constant voltage line.

3. A circuit as claimed in claim 2, wherein the current source output is coupled to the ESD protection circuit.

4. A circuit as claimed in claim 1, wherein the ESD protection circuit comprises an inductor.

5. A circuit as claimed in claim 1, wherein the shunt path comprises an off-chip RF choke.

6. A circuit as claimed in claim 1, comprising an off-chip series path between the connection to be tested and an antenna port for connection to an antenna.

7. A circuit as claimed in claim 1, wherein the testing unit comprises a voltage comparator circuit for providing an output dependent on whether or not the DC current passes through the ESD protection circuit.

8. An RF circuit comprising an RF chip and a PCB to which the RF chip is connected using a ball grid array, the PCB including an antenna, and a testing circuit as claimed in claim 1, for testing the balls which connect to the antenna terminals.

9. A method of testing a connection between an RF chip and external circuitry, comprising: injecting a DC current towards the connection to be tested; providing a path between one side of the connection to be tested and a fixed voltage line through an on-chip ESD protection circuit; providing a shunt path coupled to the other side of the connection to be tested; and determining if the current source current flows through the ESD protection circuit and thereby determine whether the connection to be tested presents a short circuit for DC, wherein the ESD protection circuit is between one side of the connection to be tested and a constant voltage line, and the shunt path is between the other side of the connection to be tested and a second connection, wherein the current source output is coupled to the second connection.

10. A method as claimed in claim 9, comprising providing the ESD protection circuit between the connection to be tested and a constant voltage line, and providing the shunt path between the connection to be tested and a constant voltage line.

11. A method as claimed in claim 9, comprising providing the ESD protection circuit between the connection to be tested and a constant voltage line, and providing an off-chip shunt path between the connection to be tested and a second connection, and coupling the current source output to the second connection.

12. A method as claimed in claim 9, comprising providing the shunt path as an off-chip RF choke.

13. A method as claimed in claim 9, wherein the determining comprises performing a voltage comparison to provide an output dependent on whether or not the DC current passes through the ESD protection circuit.

14. A testing circuit for testing a plurality of IC connections between an RF chip and external circuitry, the testing circuit comprising:
   a first connection and a second connection on an RF chip;
   a current source for injecting a DC current through the second connection and towards the first connection;
   an on-chip ESD protection circuit which provides a path between one side of the connections and a fixed voltage line;
   a shunt path coupled to the other side of the connections; and
   a testing unit, wherein the testing unit is adapted to determine if the current source current flows out of the RF chip through the second connection and returns into the RF chip through the first connection.

15. The testing circuit of claim 14, wherein the current source current is coupled to an RF choke structure on the external circuitry.

16. The testing circuit of claim 14, wherein the current source current returns the fixed voltage via the first connection and the ESD protection circuit.

* * * * *